(12) United States Patent
Kuo et al.

(10) Patent No.: US 8,616,738 B2
(45) Date of Patent: Dec. 31, 2013

(54) BACK FRAME AND BACKLIGHT SYSTEM OF FLAT PANEL DISPLAY DEVICE

(75) Inventors: Yi-Cheng Kuo, Shenzhen (CN);
Yu-Chun Hsiao, Shenzhen (CN);
Cheng-Wen Que, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 18 days.

(21) Appl. No.: 13/381,096

(22) PCT Filed: Nov. 23, 2011

(86) PCT No.: PCT/CN2011/082787
§ 371 (c)(1),
(2), (4) Date: Dec. 28, 2011

(87) PCT Pub. No.: WO2013/071602
PCT Pub. Date: May 23, 2013

(65) Prior Publication Data
US 2013/0128519 A1 May 23, 2013

(30) Foreign Application Priority Data
Nov. 18, 2011 (CN) .......................... 2011 1 0366519

(51) Int. Cl.
*F21V 29/00* (2006.01)
(52) U.S. Cl.
USPC ............................ 362/373; 362/97.1; 362/633
(58) Field of Classification Search
USPC ........ 362/628, 630–634, 97.1–97.4, 294, 373
See application file for complete search history.

(56) References Cited

U.S. PATENT DOCUMENTS

| | | | |
|---|---|---|---|
| 7,967,490 B2 * | 6/2011 | Kim et al. ...................... | 362/612 |
| 2007/0081344 A1 * | 4/2007 | Cappaert et al. .............. | 362/373 |
| 2009/0316389 A1 * | 12/2009 | Park et al. ..................... | 362/97.1 |
| 2011/0141403 A1 * | 6/2011 | Kishimoto et al. ............. | 349/65 |
| 2011/0216482 A1 * | 9/2011 | Moscovitch et al. .... | 361/679.01 |

* cited by examiner

*Primary Examiner* — Thomas Sember
(74) *Attorney, Agent, or Firm* — Cheng-Ju Chiang

(57) ABSTRACT

The present invention provides a back frame of a flat panel display device, which includes at least two primary assembling pieces and at least one secondary assembling piece, wherein the at least two primary assembling pieces are joined to form a main frame structure of the back frame and the secondary assembling piece is arranged inside the main frame structure and is joined to the main frame structure. The back frame further includes a bracing piece fixed to the primary assembling pieces or the secondary assembling piece and a heat dissipation fin set arranged on the bracing piece. The bracing piece fixes a circuit board and forms a thermal coupling between the circuit board and the heat dissipation fin set. The present invention also provides a backlight system. With the above arrangement, the back frame and backlight system of the present invention form a back frame through joining so as to make the structure of the back frame simple, save the material for the back frame, and lower down the manufacturing cost of the backlighting display devices. Further, a bracing piece of the heat dissipation fin set is used to fix the circuit board so that heat dissipation efficiency of the circuit board is improved.

6 Claims, 10 Drawing Sheets

US 8,616,738 B2

BACK FRAME AND BACKLIGHT SYSTEM OF FLAT PANEL DISPLAY DEVICE

BACKGROUND OF THE INVENTION

1. Field of the Invention

The present invention relates to the field of displaying techniques, and in particular to a back frame and a backlight system of a flat panel display device.

2. The Related Arts

The state-of-the-art liquid crystal display device comprises a front bezel, a panel, and a backlight module, of which the backlight module comprises a back frame, a reflector plate, a light guide, and a lighting assembly.

Currently, a variety of display panels of different sizes are available in the market to meet different needs of general consumers. For example, in the field of television set, the sizes of liquid crystal panels include 31.5, 42, 46, 48, and 55 inches. Different back frame molds are provided for liquid crystal planes of different sizes.

Referring to FIG. 1, FIG. 1 is a schematic view showing a conventional back frame of liquid crystal display device. As shown in FIG. 1, the conventional back frame 10 is a unitary back frame, and it is often that a unitary back frame 10 is made with metal stamping or plastic injection molding. The unitary back frame 10 consumes much material and has a high material cost. Further, a large-sized back frame 10 requires large-sized stamping equipment, and the size of mold corresponding to such a back frame 10 is large and the structure complicated, making the expenditure of the back frame mold high. As a consequence, the conventional back frame is of a high cost.

SUMMARY OF THE INVENTION

The technical issue to be addressed by the present invention is to provide a back frame and a backlight system of a flat panel display device, which save the material of a back frame and thus lower down the manufacturing cost of the flat panel display device.

To address the above technical issue, the present invention adopts a technical solution that provides a back frame of flat panel display device, which comprises at least two primary assembling pieces and at least one secondary assembling piece, wherein the at least two primary assembling pieces are joined to form a main frame structure of the back frame and the secondary assembling piece is arranged inside the main frame structure and joined to the main frame structure, the back frame further comprising a bracing piece fixed to the primary assembling pieces or the secondary assembling piece and a heat dissipation fin set arranged on the bracing piece, the bracing piece fixing a circuit board and forming a thermal coupling between the circuit board and the heat dissipation fin set.

Wherein, the circuit board is fixed to a first side of the bracing piece, the heat dissipation fin set being fixed to a second side of the bracing piece that is opposite to the first side.

Wherein, the heat dissipation fin set is mounted to the bracing piece in a removable manner.

Wherein, the heat dissipation fin set and the bracing piece are integrally formed through stamping, the heat dissipation fin set extending from the bracing piece in a direction away from the circuit board.

Wherein, the primary assembling pieces comprise a first primary assembling piece and a second primary assembling piece, the first primary assembling piece having an end forming at least two joint sections, each of the joint sections having a structure mating an end of the second primary assembling piece, the first primary assembling piece using one of the joint sections to join the corresponding end of the second primary assembling piece.

Wherein, the at least two joint sections are arranged to space from each other in a lengthwise direction of the first primary assembling piece.

Wherein, the joint sections comprise recesses formed in a surface of the first primary assembling piece and having a shape corresponding to the end of the second primary assembling piece for receiving the end of the second primary assembling piece.

Wherein, the joint sections comprise recesses formed in a surface of the first primary assembling piece, the second primary assembling piece having a surface forming protrusions at corresponding positions, the protrusions being receivable in the recesses to join the first primary assembling piece and the second primary assembling piece to each other.

Wherein, the second primary assembling piece has an end forming at least two protrusions that are arranged to space from each other in a lengthwise direction of the second primary assembling piece.

To address the above technical issue, the present invention adopts a technical solution that provides a backlight system. The backlight system comprises a light source, a light homogenization mechanism, and a back frame; and the back frame carries the light source and the light homogenization mechanism. The back frame is a back frame of the back frame described in the above embodiments.

The efficacy of the present invention is that to be distinguished from the state of the art, the present invention provides a back frame and a backlight system that form a back frame through joining so as to make the structure of the back frame simple, save the material for the back frame, and lower down the manufacturing cost of the backlighting display device. Further, a bracing piece of the heat dissipation fin set is used to fix the circuit board so that heat dissipation efficiency of the circuit board is improved.

DETAILED DESCRIPTION OF THE PREFERRED EMBODIMENTS

Figure 1:
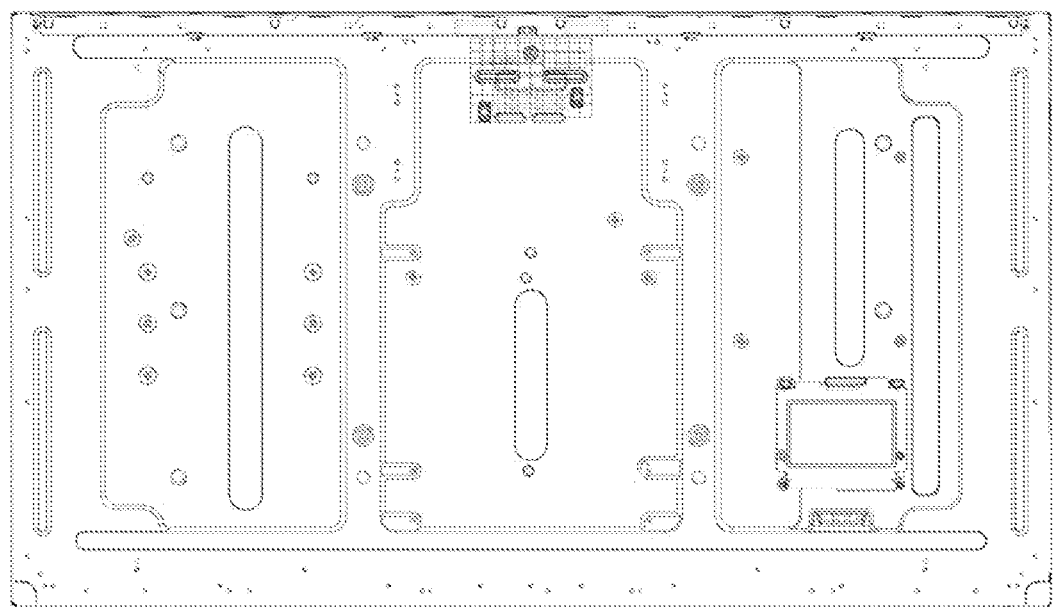
FIG. 1 is a schematic view showing a conventional back frame of liquid crystal display device.
Figure 2:
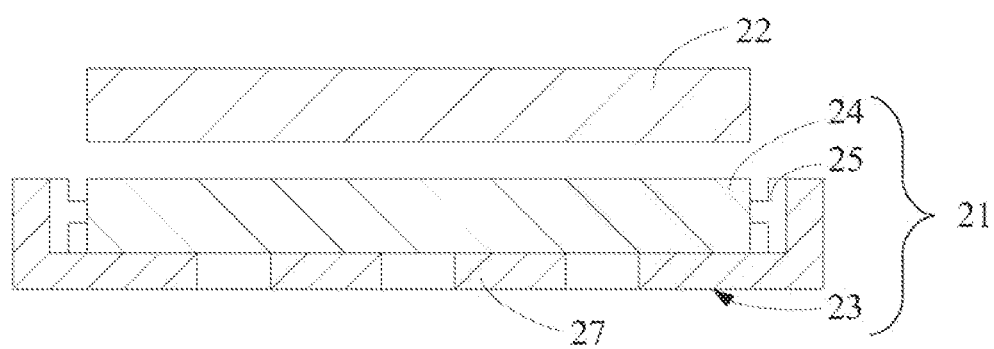
FIG. 2 is a schematic view showing a flat panel display device according to a first embodiment of the present invention.
Figure 3:
FIG. 3 is a schematic view showing a back frame of a flat panel display device according to a second embodiment of the present invention.

Referring to FIGS. 2-3, FIG. 2 is a schematic view showing a flat panel display device according to a first embodiment of the present invention and FIG. 3 is a schematic view showing a first embodiment of a back frame of a flat panel display device according to a second embodiment of the present invention. As shown in FIG. 2, the flat panel display device 20 according to the instant embodiment comprises: a backlight system 21 and a display panel 22. The backlight system 21 is arranged on a back side of the display panel 22 and supplies light to the display panel 22.

In the instant embodiment, the backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the two of at least a first and second primary assembling pieces constitute a main frame structure 27 of the back frame 23.

Referring also to FIG. 3, the back frame 23 of the first embodiment comprises a first primary assembling piece 261 and a second primary assembling piece 262. The first primary assembling piece 261 has an end joined to an end of the second primary assembling piece 262, and the first primary assembling piece 261 has another end joined to another end of the second primary assembling piece 262 in order to form the main frame structure 27 of the back frame 23. The first primary assembling piece 261 and the second primary assembling piece 262 are both aluminum pieces or galvanized steel pieces. In the instant embodiment, the first primary assembling piece 261 and the second primary assembling piece 262 are L-shaped.

Figure 4:
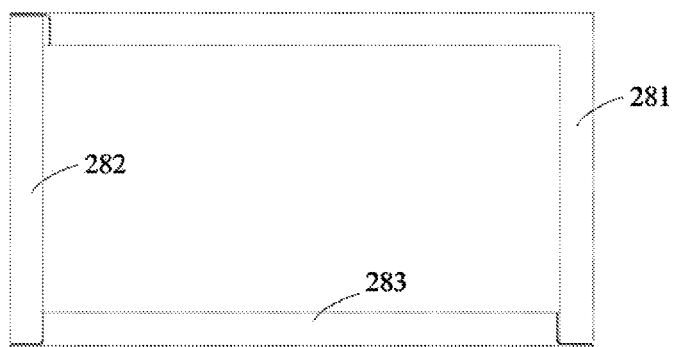
FIG. 4 is a schematic view showing a back frame of a flat panel display device according to a third embodiment of the present invention.

Referring also to FIG. 4, the back frame 23 of a second embodiment comprises a first primary assembling piece 281, a second primary assembling piece 282, and a third primary assembling piece 283. The three primary assembling pieces 281, 282, and 283 are assembled and joined to form a main frame structure 27 of the back frame 23. The three primary assembling pieces 281, 282, and 283 are all aluminum pieces or galvanized steel pieces. In the instant embodiment, the first primary assembling piece 281 is L-shaped, and the second and third primary assembling pieces 282, 283 are straight linear.

Further, the back frame 23 further comprises secondary assembling pieces arranged inside and joined to the main frame structure 27.

A detailed description will be given to the back frame 23 of the flat panel display device 20 according to the present invention, which comprises four primary assembling pieces and two secondary assembling pieces.

Figure 5:
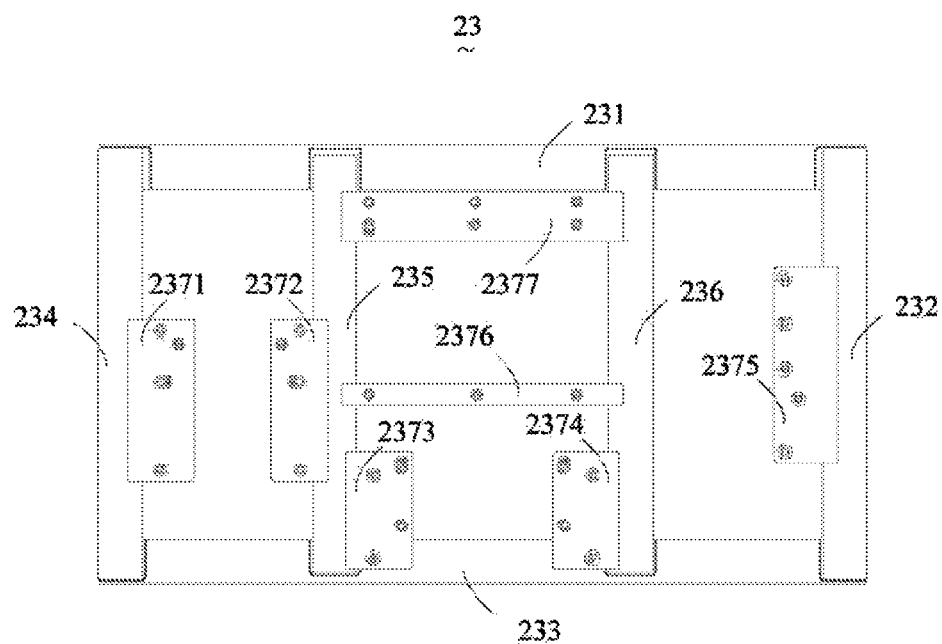
FIG. 5 is a schematic view showing a back frame of a flat panel display device according to a fourth embodiment of the present invention.

Referring to FIG. 5, FIG. 5 is a schematic view showing a back frame of flat panel display device according to a fourth embodiment of the present invention. As shown in FIG. 5, in the instant embodiment, a back frame 23 comprises: a first primary assembling piece 231, a second primary assembling piece 232, a third primary assembling piece 233, a fourth primary assembling piece 234, a first secondary assembling piece 235, a second secondary assembling piece 236, and bracing pieces 2371, 2372, 2373, 2374, 2375, 2376, and 2377. The first primary assembling piece 231, the second primary assembling piece 232, the third primary assembling piece 233, and the fourth primary assembling piece 234 are successively joined to each other in an end-to-end manner to constitute a rectangular main frame structure 27 of the back frame 23. The first secondary assembling piece 235 and the second secondary assembling piece 236, serving as ancillary assembling pieces, are arranged in the main frame structure 27 and joined to the main frame structure 27.

Specifically, an end of the first primary assembling piece 231 is joined to an end of the second primary assembling piece 232, another end of the second primary assembling piece 232 is joined to an end of the third primary assembling piece 233, another end of the third primary assembling piece 233 is joined to an end of the fourth primary assembling piece 234, and another end of the fourth primary assembling piece 234 is joined to another end of the first primary assembling piece 231 in order to form the rectangular main frame structure 27. The first primary assembling piece 231, the second primary assembling piece 232, the third primary assembling piece 233, and the fourth primary assembling piece 234 are all aluminum pieces or galvanized steel pieces. In the instant embodiment, the first primary assembling piece 231, the second primary assembling piece 232, the third primary assembling piece 233, and the fourth primary assembling piece 234 are straight linear, yet in other embodiments, it is apparent to those skilled in the art to make all the first primary assembling piece 231, the second primary assembling piece 232, the third primary assembling piece 233, and the fourth primary assembling piece 234 L-shaped, or some being straight linear and the remaining being L-shaped. For example, in FIG. 3, the first primary assembling piece 261 and the second primary assembling piece 262 are both L-shaped; in FIG. 4, the first primary assembling piece 281 is L-shaped, while the second and third primary assembling pieces 282 and 283 are straight linear.

Figure 6:
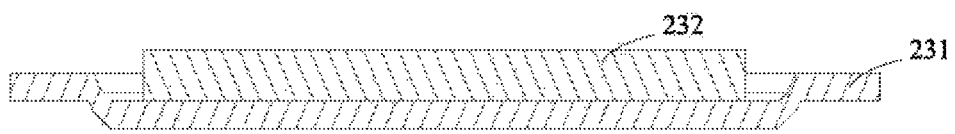
FIG. 6 is a schematic view showing a joining structure of a flat panel display device according to a fifth embodiment of the present invention.

In the instant embodiment, the back frame 23 of the flat panel display device 20 is formed by joining connection. As shown in FIG. 6, an illustrative example is given for the connection of an end of the first primary assembling piece 231 to an end of the second primary assembling piece 232, wherein the end of the second primary assembling piece 232 is joined to the end of the first primary assembling piece 231 by means of for example screwing, fastening, or welding, to have the end of the second primary assembling piece 232 connected to the end of the first primary assembling piece 231.

Figure 7:
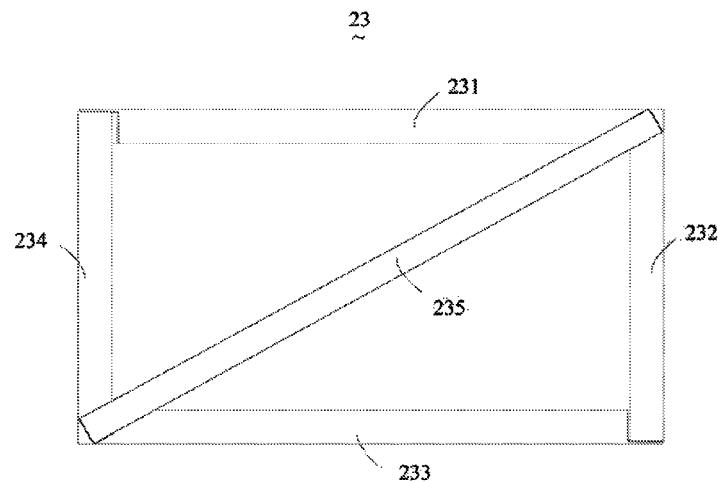
FIG. 7 is a schematic view showing a diagonally-arranged first secondary assembling piece mounted to a main frame structure of a flat panel display device according to a sixth embodiment of the present invention.
Figure 8:
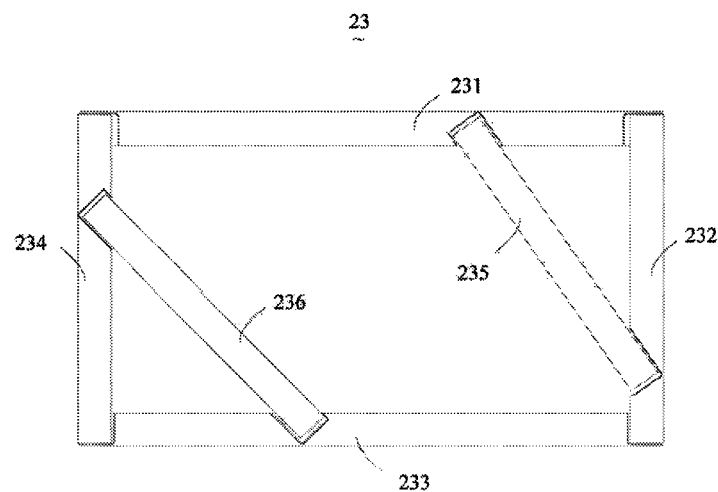
FIG. 8 is a schematic view showing a first secondary assembling piece and a second secondary assembling piece mounted to a main frame structure of a flat panel display device according to a seventh embodiment of the present invention.

In the instant embodiment, the first secondary assembling piece 235 and the second secondary assembling piece 236 are arranged in the main frame structure 27 of the back frame 23. An end of the first secondary assembling piece 235 is joined to the first primary assembling piece 231 and another end of the first secondary assembling piece 235 is joined to the third primary assembling piece 233; and an end of the second secondary assembling piece 236 is joined to the first primary assembling piece 231 and another end of the second secondary assembling piece 236 is joined to the third primary assembling piece 233. Further, the second primary assembling piece 232, the fourth primary assembling piece 234, the first secondary assembling piece 235, and the second secondary assembling piece 236 are arranged parallel to each other. In other embodiments, those skilled in the art may arrange at least one secondary assembling piece in the main frame structure 27. For example, only the first secondary assembling piece 235 is arranged in the main frame structure 27. Further, the two ends of the first secondary assembling piece 235 can be selectively joined to at least two of the primary assembling pieces of the first primary assembling piece 231, the second primary assembling piece 232, the third primary assembling piece 233, and the fourth primary assembling piece 234. For example, the first secondary assembling piece 235 is set diagonally in the main frame structure 27, as shown in FIG. 7. Similarly, the two ends of the second secondary assembling piece 236 can be selectively joined to at least two of the primary assembling pieces of the first primary assembling piece 231, the second primary assembling piece 232, the third primary assembling piece 233, and the fourth primary assembling piece 234. For example, the two ends of the first secondary assembling piece 235 are respectively joined to the first primary assembling piece 231 and the second primary assembling piece 232 that are adjacent to each other and the two ends of the second secondary assembling piece 236 are respectively joined the third primary assembling piece 233 and the fourth primary assembling piece 234 that are adjacent to each other, as shown in FIG. 8.

In the instant embodiment, the back frame 23 comprises seven bracing pieces 2371, 2372, 2373, 2374, 2375, 2376, and 2377. The bracing piece 2371 is fixed to the fourth primary assembling piece 234; the bracing pieces 2372, 2373 are both fixed to the first secondary assembling piece 235; the bracing piece 2374 is fixed to the second secondary assembling piece 236; the bracing piece 2375 is fixed to the second primary assembling piece 232; and the bracing pieces 2376, 2377 are each fixed, at two ends thereof, to the first secondary assembling piece 235 and the second secondary assembling piece 236. In practice, the bracing pieces can be fixed to one or more of the first primary assembling piece 231, the second primary assembling piece 232, the third primary assembling piece 233, the fourth primary assembling piece 234, the first secondary assembling piece 235, and the second secondary assembling piece 236. In other embodiments, those skilled in the art may mount bracing pieces of any other numbers to the back frame 23, such as one or more bracing pieces. Further, the bracing pieces can be releasably fixed to one or more of the first primary assembling piece 231, the second primary assembling piece 232, the third primary assembling piece 233, the fourth primary assembling piece 234, the first secondary assembling piece 235, and the second secondary assembling piece 236.

The bracing pieces 2371, 2372, 2373, 2374, 2375, 2376, and 2377 may be provided with bumps (not labeled) so that the back frame 23 may fix components, such as circuit boards, with such bumps.

Molds for making the back frame 23 will be described. In the instant embodiment, the first primary assembling piece 231 and the third primary assembling piece 233 are of the same size and shape so that they can be made by stamping with the same mold. The second primary assembling piece 232, the fourth primary assembling piece 234, the first secondary assembling piece 235, and the second secondary assembling piece 236 are of the same size and shape so that they can be made by stamping with the same mold, making it possible to share the mold. Thus, the back frame 23 of the present invention can be made by stamping with only two small-sized molds, and compared to the conventional back frame 10 that requires a large-sized mold, the molds for making the back frame 23 of the present invention are simple in structure and small in size and thus the cost of mold for the back frame 23 can be lowered. Further, compared to the whole back frame structure of the conventional back frame 10, the back frame 23 of the present invention can significantly save material used and thus reduce the manufacturing cost of the flat panel display device 20.

Figure 9:
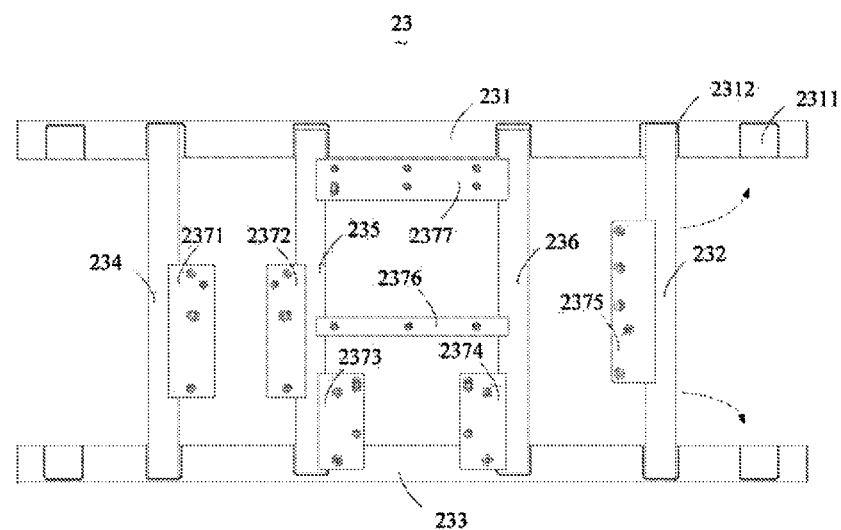
FIG. 9 is a schematic view showing joint sections of a back frame of a flat panel display device according to an eighth embodiment of the present invention.

Referring to FIG. 9, FIG. 9 is a schematic view showing joint sections of a back frame of a flat panel display device according to an eighth embodiment of the present invention. As shown in FIG. 9, in the instant embodiment, an end of the first primary assembling piece is provided with two joint sections, and the joint sections have a structure mating an end of the second primary assembling piece so that the first primary assembling piece can be joined to a corresponding end of the second primary assembling piece.

Figure 10:
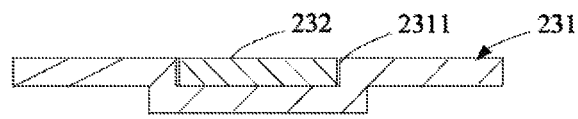
FIG. 10 is a cross-sectional view showing a first example of joint section of FIG. 9.

Specifically, the first primary assembling piece 231 has an end forming joint sections 2311, 2312, and the joint sections 2311, 2312 are arranged in a spaced manner in a lengthwise direction of the first primary assembling piece 231. The joint sections 2311, 2312 are formed by forming recesses having a shape mating an end of the second primary assembling piece 232 in the first primary assembling piece 231 in order to receive the end of the second primary assembling piece 232 therein. As shown in FIG. 10, the joint sections 2311, 2312 are recesses that do not extend through opposite surfaces of the end of the first primary assembling piece 231 and the recesses are of a rectangular shape with the second primary assembling piece 232 being straight linear.

Figure 11:
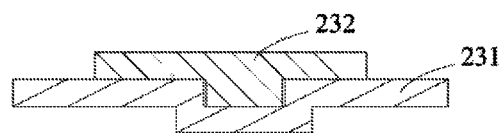
FIG. 11 is a schematic view showing a joining structure of a joint section of a back frame of a flat panel display device according to a ninth embodiment of the present invention.

To assemble a large-sized back frame 23, the joint section 2311 that is close to the very end of the first primary assembling piece 231 is first taken and a second primary assembling piece 232 having a corresponding width is selected. Afterwards, an end of the second primary assembling piece 232 is positioned in the recess of the joint section 2311. And then, means, such as screwing, fastening, or welding, is applied to join and fix the end of the second primary assembling piece 232 to the joint section 2311. To assemble a small-sized back frame 23, the joint section 2312 that is distant from the very end of the first primary assembling piece 231 is first chosen and a second primary assembling piece 232 having a corresponding width is selected. Afterwards, an end of the second primary assembling piece 232 is positioned in the recess of the joint section 2312. And then, means, such as screwing, fastening, or welding, is applied to join and fix the end of the second primary assembling piece 232 to the joint section 2312. Specifically, for example the second primary assembling piece 232 forms a protrusion at a corresponding location on a surface thereof, and the protrusion of the second primary assembling piece 232 is embedded in the recess of the first primary assembling piece 231 at a corresponding location in order to join the first primary assembling piece 231 and the second primary assembling piece 232, as shown in FIG. 11. Further, the second primary assembling piece 232 may form, on one end thereof, at least two protrusions that are spaced in the lengthwise direction of the second primary assembling piece 232, such as two, three, or four protrusions.

Figure 12:
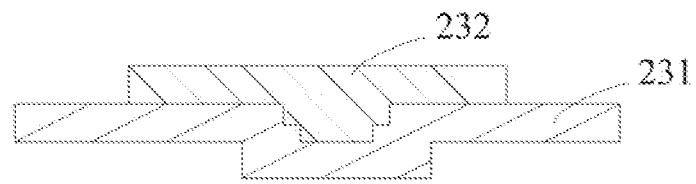
FIG. 12 is a schematic view showing a joining structure of a joint section of a back frame of a flat panel display device according to a tenth embodiment of the present invention.
Figure 13:
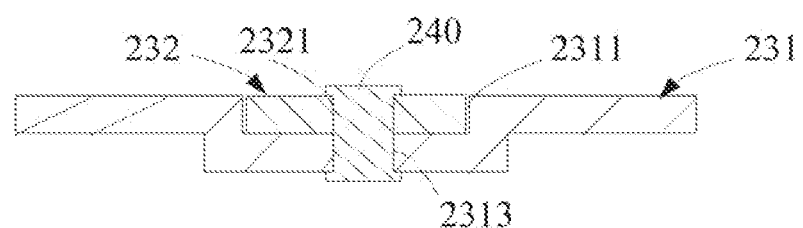
FIG. 13 is a schematic view showing a joining structure of a joint section of a back frame of a flat panel display device according to an eleventh embodiment of the present invention.

Furthermore, the recess of the first primary assembling piece 231 can be a recess of a multi-stepped configuration and the second primary assembling piece 232 forms, at a corresponding location, a protrusion having a multi-stepped configuration corresponding to the recess, as shown in FIG. 12. Further, as shown in FIG. 13, taking the joint section 2311 as an example, the recess of the first primary assembling piece 231 forms, in a bottom thereof, a first through hole 2313, and the second primary assembling piece 232 forms, at a location corresponding to the joint section 2311, a second through hole 2321. The back frame 23 further comprises a fastener 240. The fastener 240 extends through the first through hole 2313 and the second through hole 2321 to joint the first primary assembling piece 231 and the second primary assembling piece 232 to each other.

Figure 14:
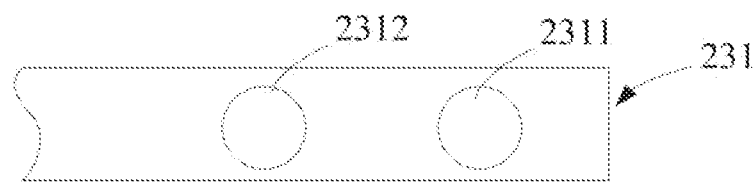
FIG. 14 is a schematic view showing a joint section of a back frame of a flat panel display device according to a twelfth embodiment of the present invention.

As shown in FIG. 14, in another embodiment of the back frame of flat panel display device according to the present invention, the recesses of the joint sections 2311, 2312 of the first primary assembling piece 231 are of a circular shape. Yet, in other embodiments, those skilled in the art may arrange the shape of the recesses to be other polygonal configurations, such as triangle.

Figure 15:
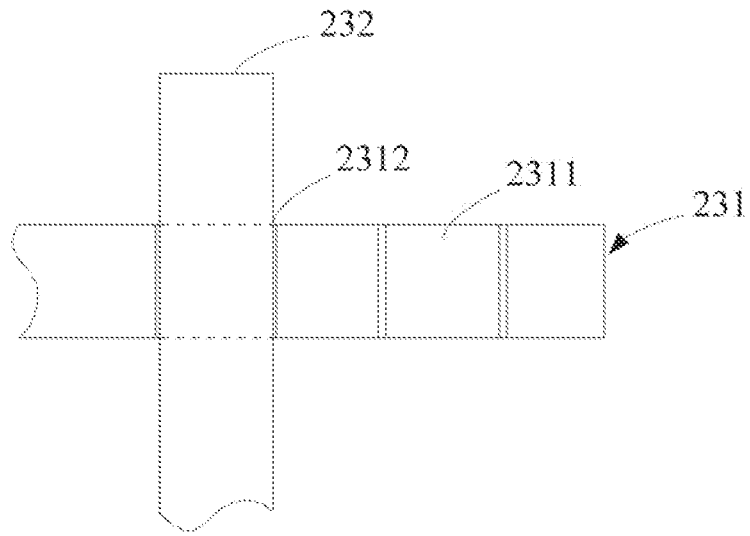
FIG. 15 is a schematic view showing a joint section of a back frame of a flat panel display device according to a thirteenth embodiment of the present invention.

As shown in FIG. 15, in another embodiment of the back frame of flat panel display device according to the present invention, the joint sections 2311, 2312 are recesses that do not extend through opposite surfaces of the first primary assembling piece 231, whereby an end of the second primary assembling piece 232 is movable within the joint sections 2311, 2312. For example, after the end of the second primary assembling piece 232 is set extending beyond and joined and fixed to the joint section 2312, the portion of extension is then trimmed off so that the length of the second primary assembling piece 232 that serves as a primary assembling piece of the back frame can be adjusted.

In a practical application, the other end of the first primary assembling piece 231 and both ends of the third primary assembling piece 233 are all provided with two joint sections having a structure identical to that of the joint sections 2311, 2312. The ends of the second primary assembling piece 232 and the ends of the fourth primary assembling piece 234 may be subjected to specific designs or no design at all according to the application. For example:

(1) In a first situation, as shown in FIG. 10, the two ends of the second primary assembling piece 232 and the two ends of the fourth primary assembling piece 234 are of no specific design. In other words, the ends are of the same structure as the remaining portions. Under this condition, in making a join with a selected joint section 2311 (2312) at one end of the first primary assembling piece 231 (the same applicable to the other end), if an attempt is made to change the width of the back frame 23, then the length of the corresponding second primary assembling piece 232 and fourth primary assembling piece 234 must be selected accordingly. Namely, if the joint section 2311 that is close to the very end of the first primary assembling piece 231 is selected for joining, then no trimming is applied to the second primary assembling piece 232 and the fourth primary assembling piece 234 or the portion that is trimmed off is short; if the joint section 2312 that is distant from the very end of the first primary assembling piece 231 is selected for joining, then the second primary assembling piece 232 and the fourth primary assembling piece 234 are trimmed and the trimmed portion being long or short is according to the distance that the joint section is from the very end of the first primary assembling piece 231 being great or small; and (2) In a second situation, it is similar to the first situation, but as shown in FIG. 11, the second primary assembling piece 232 and the fourth primary assembling piece 234 use different protrusions to respectively mate the first primary assembling piece 231 and the third primary assembling piece 233 in order to realize change of width of the back frame 23; similarly, if a joint section 2312 other than the first joint section 2311 that is close to the very end of the first primary assembling piece 231 is selected for joining, then before or after joining, excessive portions of the second primary assembling piece 232 and the fourth primary assembling piece 234 may be trimmed off.

This also applicable to a main frame structure 27 of the back frame 23 that is formed by joining two L-shaped primary assembling pieces.

In summary, the present invention provides a back frame 23 having a first primary assembling piece that is provided with at least two joint sections. The number of the joint section can be selected according to the requirement of customers. In the instant embodiment, a description is given to an example comprising two joint sections 2311, 2312. Thus, to prepare the molds for making the back frame 23, only two sets of mold are needed, namely one mold for a first primary assembling piece and the other mold for a second primary assembling piece. The first primary assembling piece may be provided with a plurality of joint sections for joining operation in order to form various sizes for the back frame 23. To assemble the back frame 23, based on the desired size of the back frame 23, the corresponding one of the joint sections is selected. With the joint section, the second primary assembling piece is joined to the joint section of the first primary assembling piece and the other joint section of the first primary assembling piece that is located outward of the joining location of the second primary assembling piece is trimmed off to obtain a desired size of the back frame 23. Compared to the conventional technology that requires different back frame molds for making different sizes of back frame 10, the back frame of the flat panel display device 23 according to the present invention requires only a mold for the first primary assembling piece and a mold for the second primary assembling piece 28 so that mold sharing among various sizes of product can be realized and the molds used are of simple structures, allowing of reduction of expenditure of the molds for back frames.

The present invention also provides a mold for making a back frame of flat panel display device. The back frame mold is provided with a main pattern for forming a primary assembling piece of the back frame and the main pattern comprises a sub-pattern that forms at least two joint sections on an end of the primary assembling piece. The primary assembling piece comprises the previously discussed first primary assembling piece and second primary assembling piece, corresponding to the above mentioned main pattern; and the joint section comprises the previously discussed joint section of the first primary assembling piece, corresponding to the above mentioned sub-pattern. Repeated description is omitted herein.

Figure 16:
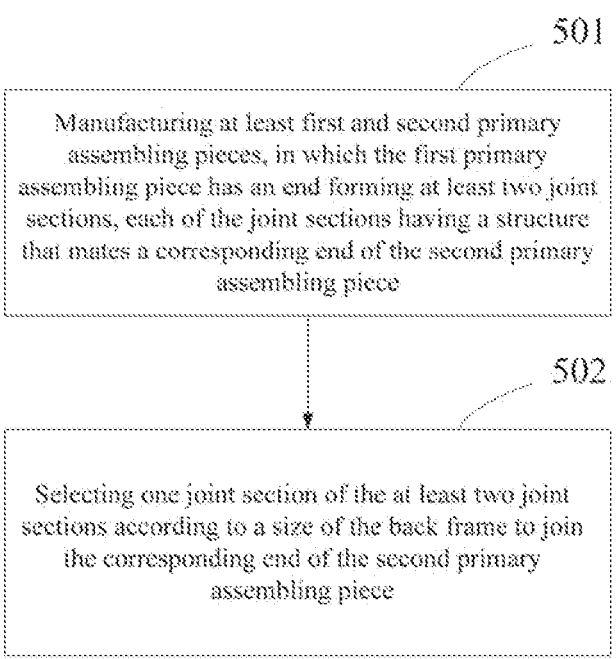
FIG. 16 is a flow chart showing a method for manufacturing a back frame of a flat panel display device according to a fourteenth embodiment of the present invention.

As shown in FIG. 16, the present invention also provides a method for making a back frame of flat panel display device. The method comprises the following steps:

Step 501: manufacturing at least first and second primary assembling pieces, in which the first primary assembling piece has an end forming at least two joint sections, each of the joint sections having a structure that mates a corresponding end of the second primary assembling piece; and Step 502: selecting one joint section of the at least two joint sections according to a size of the back frame to join the corresponding end of the second primary assembling piece.

In the instant embodiment, when other joint sections are present between the joining location of the second primary assembling piece and the end of the first primary assembling piece, before or after the step of selecting one joint section of the at least two joint sections according to a size of the back frame to join the corresponding end of the second primary assembling piece, the other joint sections of the first primary assembling piece that are located outward of the joining position of the second primary assembling piece are trimmed off. The first primary assembling piece comprises the previously discussed first primary assembling piece, and the second primary assembling piece comprises the previously discussed second primary assembling piece, and repeated description will be omitted herein.

Figure 17:
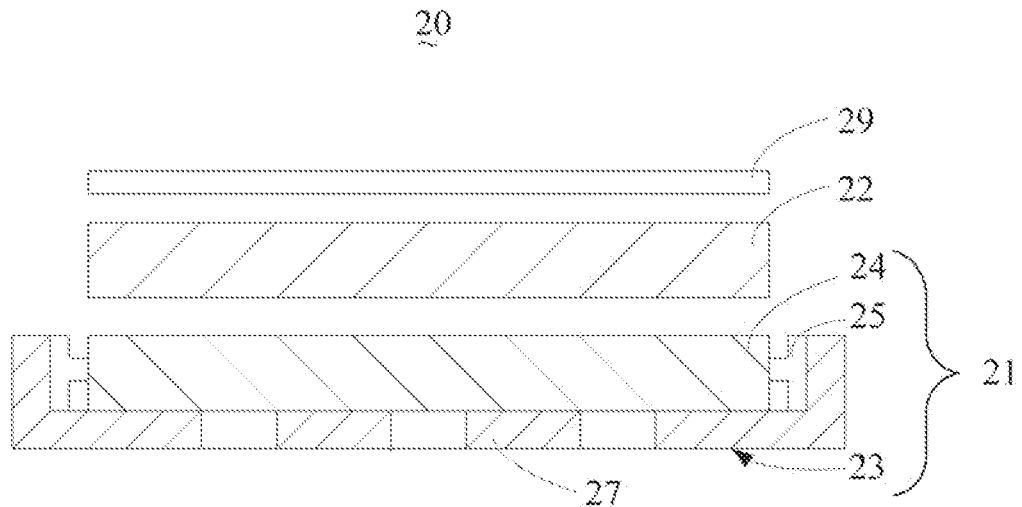
FIG. 17 is a schematic view showing a flat panel display device with a touch screen according to a fifteenth embodiment of the present invention.

As shown in FIG. 17, the flat panel display device 20 of the present invention further comprises a touch screen 29. The touch screen 29 is arranged on a light exit surface of the display panel 22 of the flat panel display device 20. The flat panel display device 20 comprises: the backlight system 21 and the above discussed display panel 22. The backlight system 21 is arranged at the back side of the display panel 22 and supplies light to the display panel 22.

The backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the at least one first and second primary assembling pieces constitute a main frame structure 27 of the back frame 23.

It is noted that the flat panel display device 20 of the present invention can be a liquid crystal display device or a liquid crystal television.

Figure 18:
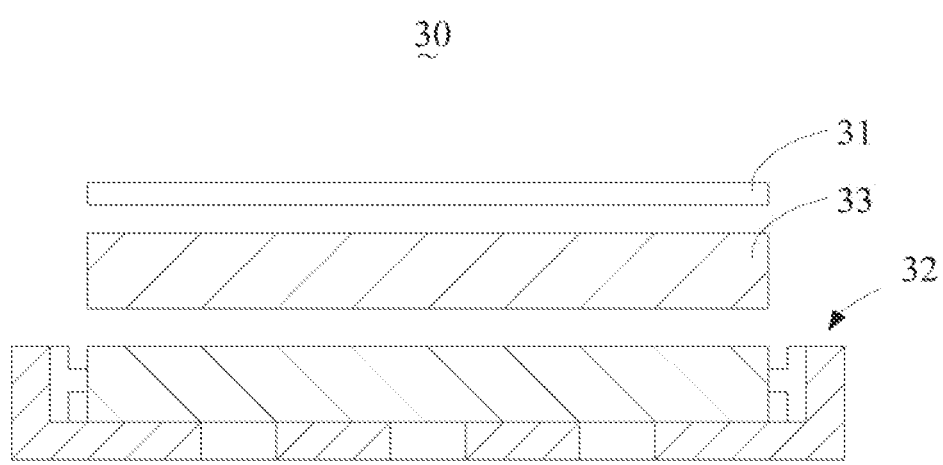
FIG. 18 is a schematic view showing a stereoscopic display device according to a sixteenth embodiment of the present invention.

The present invention also provides a stereoscopic display device 30, as shown in FIG. 18. The stereoscopic display device 30 comprises a liquid crystal lens grating 31, a backlight system 32, and a display panel 33. The liquid crystal lens grating 31 is arranged on a light exit surface of the display panel 33. The backlight system 32 can be a backlight system of one of the above discussed embodiments, such as the backlight system 32 comprising the back frame 23. The back frame 23 comprises at least first primary assembling piece and the second primary assembling piece. The at least first and second primary assembling pieces form a main frame structure of the back frame. Repeated description will be omitted herein.

Figure 19:
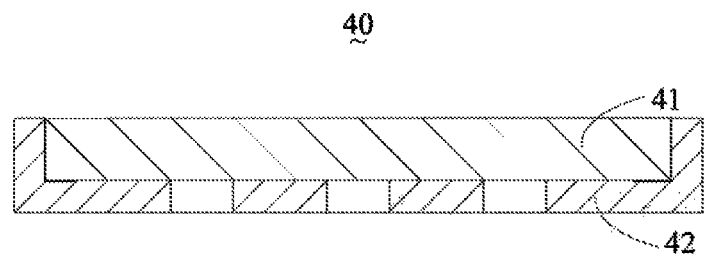
FIG. 19 is a schematic view showing a plasma display device according to a seventeenth embodiment of the present invention.

The present invention also provides a plasma display device 40, as shown in FIG. 19. The plasma display device 40 comprises a plasma display panel 41 and a back frame 42. The back frame 42 is arranged at a back side of the display panel 41. The back frame 42 can be the back frame of any of the previously discussed embodiments and repeated description will be omitted herein.

Figure 20:
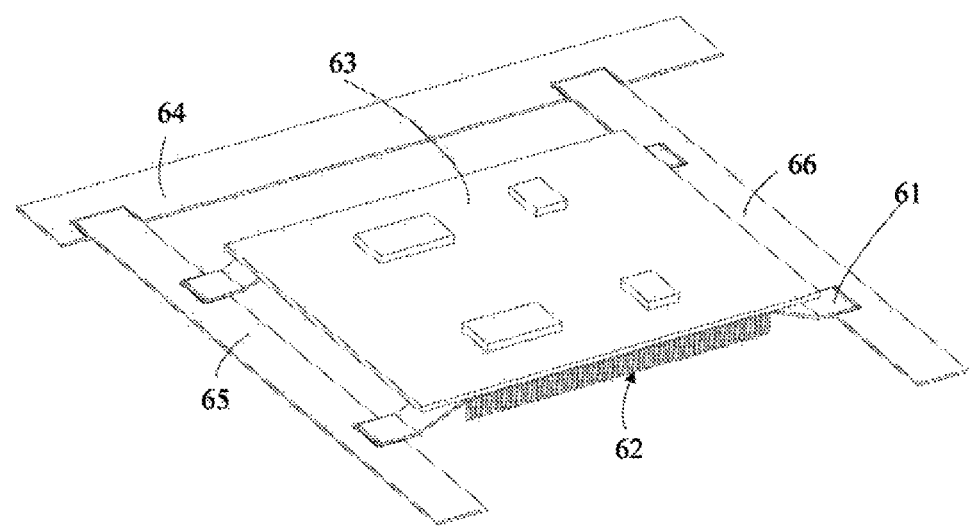
FIG. 20 is a schematic view showing a portion of a back frame of a flat panel display device according to an eighteenth embodiment of the present invention.

The present invention also provides a circuit board mounting means that is applicable to each of the above described embodiments. Referring to FIG. 20, assembling pieces 64, 65, and 66 are the various assembling pieces described in the above discussed embodiments, such as the primary assembling pieces that are joined to form a main frame structure of back frame or the secondary assembling pieces that are arranged inside the main frame structure and joined to the main frame structure. A bracing piece 61 is fixed to the assembling piece 65 and the assembling piece 66. In other embodiments, the bracing piece 61 can be fixed to a proper assembling piece at only one end, while the other end suspends. The bracing piece 61 is provided with a heat dissipation fin set 62. The bracing piece 61 fixes a circuit board 63 and forms thermal coupling between the circuit board 63 and the heat dissipation fin set 62.

Figure 21:
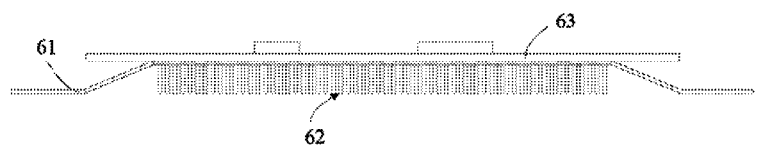
FIG. 21 is a side elevational view of a bracing piece, a heat dissipation fin set, and a circuit board of the back frame shown in FIG. 20.
Figure 22:
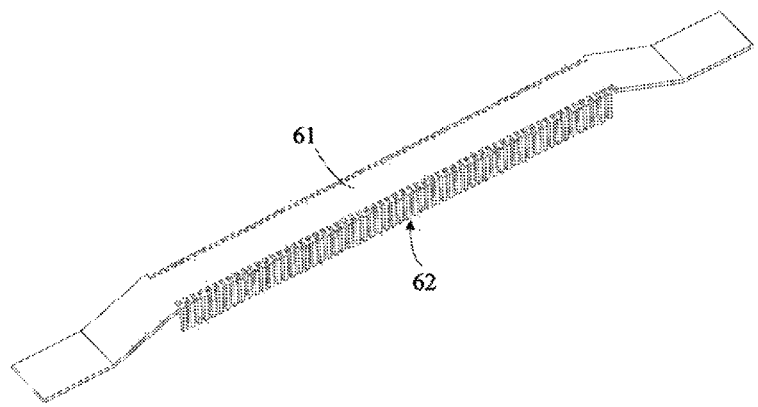
FIG. 22 is a schematic view of the bracing piece and the heat dissipation fin set of the back frame shown in FIG. 20.
Figure 23:
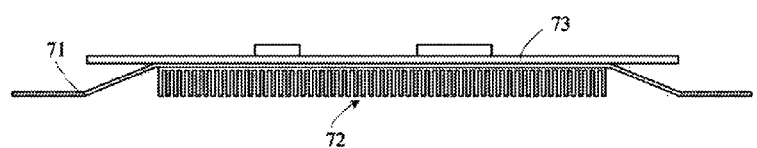
FIG. 23 is a side-elevational view of a bracing piece, a heat dissipation fin set, and a circuit board of a back frame according to a nineteenth embodiment of the present invention.

As shown in FIGS. 21-22, circuit board 63 is fixed to one side of the bracing piece 61. The heat dissipation fin set 62 is integrally formed with bracing piece 61 by means of stamping and the heat dissipation fin set 62 extends from the bracing piece 61 in a direction away from the circuit board 63. The heat dissipation fin set 62 employs thermal transmission through the bracing piece 61 to form thermal coupling with the circuit board 63.

As shown in FIG. 22, in the instant embodiment, a circuit board 73 is fixed to a first side of a bracing piece 71. A heat dissipation fin set 72 is separately manufactured and is fixed to a second side of the bracing piece 71 that is opposite to the first side and is preferably mounted to the bracing piece 71 in a removable manner, so that the heat dissipation fin set 72 can be removed from the bracing piece 71. The heat dissipation fin set 72 also employs thermal transmission through the bracing piece 71 to form thermal coupling with the circuit board 73. In other embodiments, the heat dissipation fin set 72 can be set in direct contact with the circuit board 73, such as through a hollow portion formed in the bracing piece 71.

In the embodiments illustrated in FIGS. 20-23, the heat dissipation fin set is set on a corresponding bracing piece in order to allow the circuit board to dissipate heat through the heat dissipation fin set. Selection of high thermal conductivity material may further ensure increase of operation stability of the circuit board. With the above arrangement, the back frame and backlight system of the present invention form a back frame through joining so as to make the structure of the back frame simple, save the material for the back frame, and lower down the manufacturing cost of the backlighting display devices. Further, a bracing piece of the heat dissipation fin set is used to fix the circuit board so that heat dissipation efficiency of the circuit board is improved.

Embodiments of the present invention have been described, but are not intending to impose any undue constraint to the appended claims of the present invention. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A back frame of a flat panel display device, which comprises at least two primary assembling pieces and at least one secondary assembling piece, the at least two primary assembling pieces being joined to form a main frame structure of the back frame, the secondary assembling piece being arranged inside the main frame structure and joined to the main frame structure, the back frame further comprising a bracing piece fixed to the primary assembling pieces or the secondary assembling piece and a heat dissipation fin set arranged on the bracing piece, the bracing piece fixing a circuit board and forming a thermal coupling between the circuit board and the heat dissipation fin set;

wherein the primary assembling pieces comprise a first primary assembling piece and a second primary assembling piece, the first primary assembling piece having an end forming at least two joint sections, each of the joint sections having a structure mating an end of the second primary assembling piece, the first primary assembling piece using one of the joint sections to join the corresponding end of the second primary assembling piece.

2. The back frame as claimed in claim 1, wherein the at least two joint sections are arranged to space from each other in a lengthwise direction of the first primary assembling piece.

3. The back frame as claimed in claim 2, wherein the joint sections comprise recesses formed in a surface of the first primary assembling piece and having a shape corresponding to the end of the second primary assembling piece for receiving the end of the second primary assembling piece.

4. The back frame as claimed in claim 2, wherein the joint sections comprise recesses formed in a surface of the first primary assembling piece, the second primary assembling piece having a surface forming protrusions at corresponding positions, the protrusions being receivable in the recesses to join the first primary assembling piece and the second primary assembling piece to each other.

5. The back frame as claimed in claim 4, wherein the second primary assembling piece has an end having a surface forming at least two protrusions that are arranged to space from each other in a lengthwise direction of the second primary assembling piece.

6. A backlight system, wherein:

the backlight system comprises a light source, a light homogenization mechanism, and a back frame; and the back frame carries the light source and the light homogenization mechanism, the back frame being a back frame claimed in claim 1.

* * * * *